United States Patent
Kurashima

(10) Patent No.: US 8,786,653 B2
(45) Date of Patent: Jul. 22, 2014

(54) LIGHT QUANTITY CONTROL DEVICE, EXPOSURE DEVICE, AND IMAGE FORMING APPARATUS

(71) Applicant: Fuji Xerox Co., Ltd., Tokyo (JP)

(72) Inventor: Satoshi Kurashima, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/763,866

(22) Filed: Feb. 11, 2013

(65) Prior Publication Data

US 2014/0071219 A1 Mar. 13, 2014

(30) Foreign Application Priority Data

Sep. 12, 2012 (JP) .................................. 2012-200553

(51) Int. Cl.
*B41J 2/435* (2006.01)
*B41J 2/47* (2006.01)

(52) U.S. Cl.
USPC .......................................... 347/237; 347/247

(58) Field of Classification Search
USPC ................... 347/236, 237, 246, 247
See application file for complete search history.

(56) References Cited

U.S. PATENT DOCUMENTS

| | | | | |
|---|---|---|---|---|
| 5,134,427 | A | * | 7/1992 | Akiyama et al. ............... 347/153 |
| 7,738,519 | B2 | * | 6/2010 | Wong .......................... 372/38.02 |
| 8,238,393 | B2 | * | 8/2012 | Iwasaki ....................... 372/38.01 |
| 2004/0208650 | A1 | * | 10/2004 | Suzuki ........................... 398/195 |
| 2012/0268723 | A1 | * | 10/2012 | Seki ................................ 355/67 |

FOREIGN PATENT DOCUMENTS

| | | | | | |
|---|---|---|---|---|---|
| JP | 05063652 | A | * | 3/1993 | ............ H04B 10/04 |
| JP | 10-190115 | A | | 7/1998 | |
| JP | 10-209545 | A | | 8/1998 | |
| JP | 2005-191453 | A | | 7/2005 | |

* cited by examiner

*Primary Examiner* — Hai C Pham
(74) *Attorney, Agent, or Firm* — Sughrue Mion, PLLC

(57) ABSTRACT

A light quantity control device includes a light quantity detecting unit and an output unit. The light quantity detecting unit detects a quantity of laser light emitted from semiconductor laser elements which are mounted on plural mount devices. The output unit is provided on at least a reference mount device among the plural mount devices and outputs, to another mount device other than the reference mount device among the plural mount devices, an output result which is obtained through comparison and correction of a value detected by the light quantity detecting unit and a reference value.

13 Claims, 8 Drawing Sheets

LIGHT QUANTITY CONTROL DEVICE, EXPOSURE DEVICE, AND IMAGE FORMING APPARATUS

CROSS-REFERENCE TO RELATED APPLICATIONS

This application is based on and claims priority under 35 USC 119 from Japanese Patent Application No. 2012-200553 filed Sep. 12, 2012.

BACKGROUND

Technical Field

The present invention relates to a light quantity control device, an exposure device, and an image forming apparatus.

SUMMARY

According to an aspect of the invention, there is provided a light quantity control device including a light quantity detecting unit and an output unit. The light quantity detecting unit detects a quantity of laser light emitted from semiconductor laser elements which are mounted on plural mount devices. The output unit is provided on at least a reference mount device among the plural mount devices and outputs, to another mount device other than the reference mount device among the plural mount devices, an output result which is obtained through comparison and correction of a value detected by the light quantity detecting unit and a reference value.

BRIEF DESCRIPTION OF THE DRAWINGS

Exemplary embodiments of the present invention will be described in detail based on the following figures, wherein.

DETAILED DESCRIPTION

Hereinafter, an exemplary embodiment of the present invention will be described with reference to the drawings.

First Exemplary Embodiment

Figure 2:
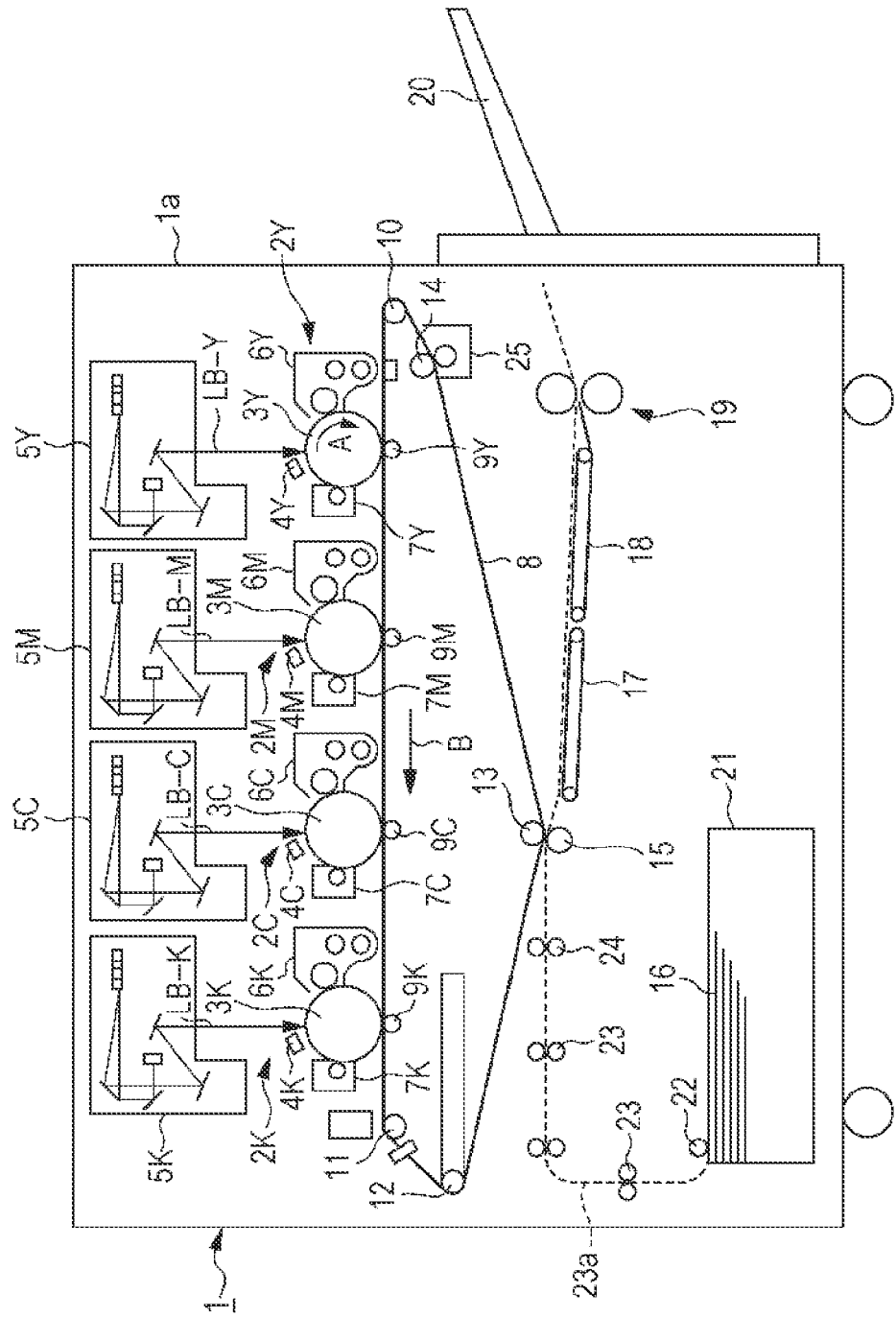
FIG. 2 is a diagram illustrating the configuration of an image forming apparatus including the light quantity control device and an exposure device according to the first exemplary embodiment of the invention.

FIG. 2 illustrates a full-color image forming apparatus employing a tandem system, which is an image forming apparatus according to a first exemplary embodiment of the present invention including a light quantity control device and an exposure device. Of course, an exemplary embodiment of the present invention is not limited to the image forming apparatus employing a tandem system, and may also be applied to a four-cycle full-color image forming apparatus including a single photoconductor drum.

As illustrated in FIG. 2, in a housing 1a of an image forming apparatus 1 according to the first exemplary embodiment, four image forming units 2Y, 2M, 2C, and 2K corresponding to yellow (Y), magenta (M), cyan (C), and black (K) are arranged in a line as plural image forming units.

As illustrated in FIG. 2, all of the four image forming units 2Y, 2M, 2C, and 2K have basically the same configuration, except for the type of toner to be used. Each of the image forming units 2Y, 2M, 2C, and 2K includes a photoconductor drum 3, a scorotron 4, an exposure device 5, a developing device 6, and a cleaning device 7. The photoconductor drum 3 is an image carrier that is driven in the direction indicated by an arrow A at a predetermined rotation speed. The scorotron 4 is a first charging unit that evenly charges the surface of the photoconductor drum 3. The exposure device 5 is a latent image forming unit that exposes an image of the corresponding color on the surface of the photoconductor drum 3 to light so as to form an electrostatic latent image. The developing device 6 is a developing unit that develops the electrostatic latent image formed on the photoconductor drum 3 by using toner of the corresponding color. The cleaning device 7 removes residual toner that remains after a transfer process from the surface of the photoconductor drum 3.

The surfaces of the photoconductor drums 3Y, 3M, 3C, and 3K of the image forming units 2Y, 2M, 2C, and 2K are evenly charged by the scorotrons 4Y, 4M, 4C, and 4K so as to have a predetermined negative-polarity potential. Then, pieces of image data corresponding to the individual colors are sequentially output to the exposure devices 5Y, 5M, 5C, and 5K of the image forming units 2Y, 2M, 2C, and 2K. The surfaces of the photoconductor drums 3Y, 3M, 3C, and 3K are exposed to laser beams LB-Y, LB-M, LB-C, and LB-K, which are emitted from the exposure devices 5Y, 5M, 5C, and 5K in accordance with the pieces of image data, in a scanning manner along a main scanning direction (the direction along the axis of the photoconductor drum 3), and thereby electrostatic latent images are formed on the surfaces of the photoconductor drums 3Y, 3M, 3C, and 3K. The electrostatic latent images formed on the photoconductor drums 3Y, 3M, 3C, and 3K are developed to be toner images of the individual colors Y, M, C, and K by the corresponding developing devices 6Y, 6M, 6C, and 6K.

The toner images of the individual colors Y, M, C, and K which have been formed on the photoconductor drums 3Y, 3M, 3C, and 3K of the image forming units 2Y, 2M, 2C, and 2K are first-transferred onto an intermediate transfer belt 8 by first transfer rollers 9Y, 9M, 9C, and 9K serving as first transfer units, such that the toner images are superposed on one another. The intermediate transfer belt 8 is an intermediate transfer body that is disposed below the image forming units 2Y, 2M, 2C, and 2K, as illustrated in FIG. 2.

The intermediate transfer belt 8 extends around plural rollers, such as a driving roller 10, a driven roller 11, a tension applying roller 12, a back support roller 13 in a second transfer section, and a driven roller 14, with a predetermined tension. The intermediate transfer belt 8 is driven by the driving roller 10 which is driven and rotated by a dedicated driving motor having a favorable constant speed characteristic (not illustrated), so as to be rotated in the direction indicated by an arrow B at a predetermined speed which is substantially equal to the rotation speed of the photoconductor drums 3Y, 3M, 3C, and 3K. The intermediate transfer belt 8 is, for example, an endless belt made of an elastic synthetic-resin film, which is made of polyimide, polyamide, or the like.

The toner images of the individual colors Y, M, C, and K which have been transferred onto the intermediate transfer belt 8 in a multilayered manner are simultaneously second-transferred onto a recording sheet 16, which is a recording medium, by a second transfer roller 15. The second transfer roller 15 is a second transfer unit that is pressed against the back support roller 13 via the intermediate transfer belt 8. The recording sheet 16 onto which the toner images of the individual colors have been transferred is transported to a fixing device 19 by a pair of transport belts 17 and 18. Then, the recording sheet 16 onto which the unfixed toner images of the individual colors have been transferred undergoes a fixing process, which is performed by the fixing device 19 using heat and pressure, and is output to an output tray 20 that is provided outside the housing 1a of the image forming apparatus 1.

As illustrated in FIG. 2, recording sheets 16 are accommodated in one or plural sheet trays 21, which are disposed in a bottom portion of the housing 1a of the image forming apparatus 1, and have a predetermined size and are made of a predetermined material. The recording sheets 16 are separately transported one by one to registration rollers 24 via a sheet transport path 23a, which is provided with a sheet feed roller 22 and sheet transport rollers 23. Each recording sheet 16 which has been fed from the sheet tray 21 is transported to a second transfer position of the intermediate transfer belt 8 by the registration rollers 24, which are driven and rotated in synchronization with the toner images on the intermediate transfer belt 8.

After a first transfer process of toner images has finished, the surfaces of the photoconductor drums 3 are cleaned by the cleaning devices 7. After a second transfer process of toner images has finished, the surface of the intermediate transfer belt 8 is cleaned by a belt cleaning device 25, which is disposed so as to face the driven roller 14.

Figure 3:
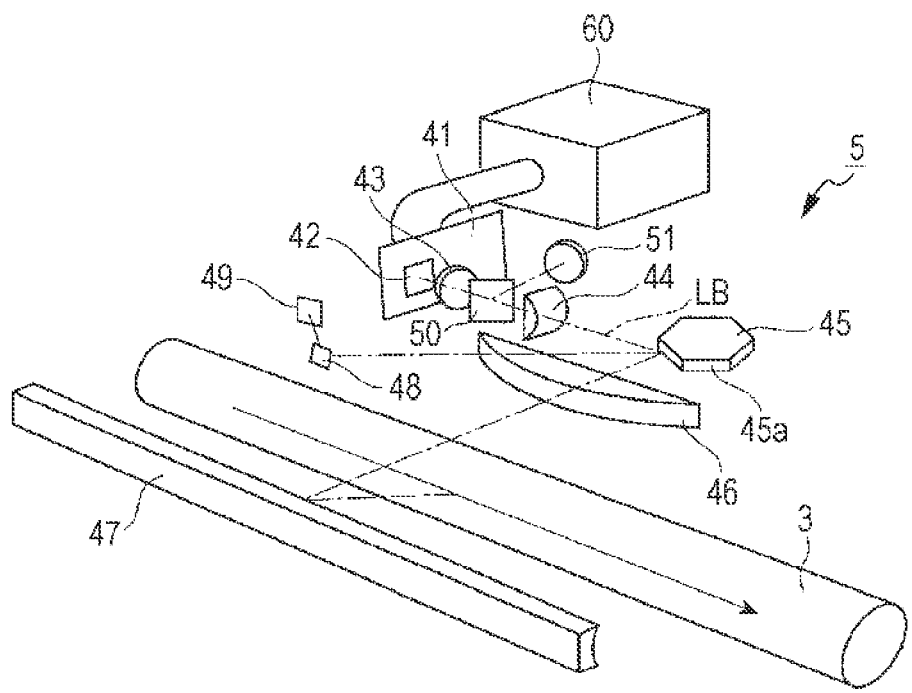
FIG. 3 is a perspective view illustrating the configuration of the exposure device.

FIG. 3 is a diagram illustrating the configuration of the exposure device 5 according to the first exemplary embodiment of the present invention.

The exposure device 5 includes a semiconductor laser array 42, which is mounted on a circuit board 41 serving as a mount device. Laser beams LB emitted from the semiconductor laser array 42 are collimated by a collimator lens 43, and are applied via a cylindrical lens 44 onto the surface of a rotating polygon mirror 45, which is driven and rotated at high speed, such that the laser beams LB are focused only in a sub-scanning direction. The laser beams LB which have been applied onto the surface of the rotating polygon mirror 45 are reflected by individual mirror surfaces 45a of the rotating polygon mirror 45 and are deflected at a predetermined angle. Then, the focal length is adjusted by an f-θ lens 46 in accordance with the deflection angle, and the photoconductor drum 3 is exposed to the laser beams LB at uniform speed in a scanning manner along the axis direction of the photoconductor drum 3 (main scanning direction) via a cylindrical mirror 47. In this exemplary embodiment, the collimator lens 43, the cylindrical lens 44, the rotating polygon mirror 45, the f-θ lens 46, the cylindrical mirror 47, and so forth constitute an optical scanning system.

Also, the laser beams LB which are applied for scanning to one end side outside an image region by the rotating polygon mirror 45 are reflected by a pick-up mirror 48, and enter a main-scanning detection sensor 49 that detects a scanning start time in the main scanning direction.

Furthermore, a half mirror 50 that reflects part of the laser beams LB emitted from the semiconductor laser array 42 is disposed between the collimator lens 43 and the cylindrical lens 44. Each laser beam LB which has been emitted from the semiconductor laser array 42 and which has been reflected by the half mirror 50 is received by a monitor photodiode (MPD) 51, which is as a light quantity detection unit.

In FIG. 3, only one laser beam LB is illustrated. However, plural laser beams LB are actually emitted from the semiconductor laser array 42.

Figure 4:
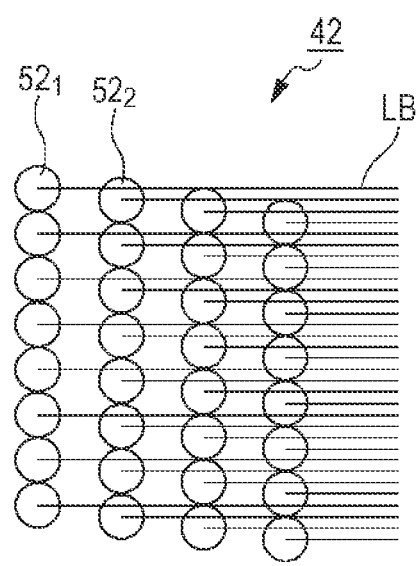
FIG. 4 is a schematic view illustrating the arrangement of semiconductor laser diodes of a semiconductor laser array.

As illustrated in FIG. 4, the semiconductor laser array 42 includes plural semiconductor laser diodes 52, which are plural semiconductor laser elements (light-emitting elements), and is capable of simultaneously emitting plural laser beams LB. The semiconductor laser diodes 52 of the semiconductor laser array 42 are arranged so as to be displaced in the main scanning direction and the sub-scanning direction.

Figure 5:
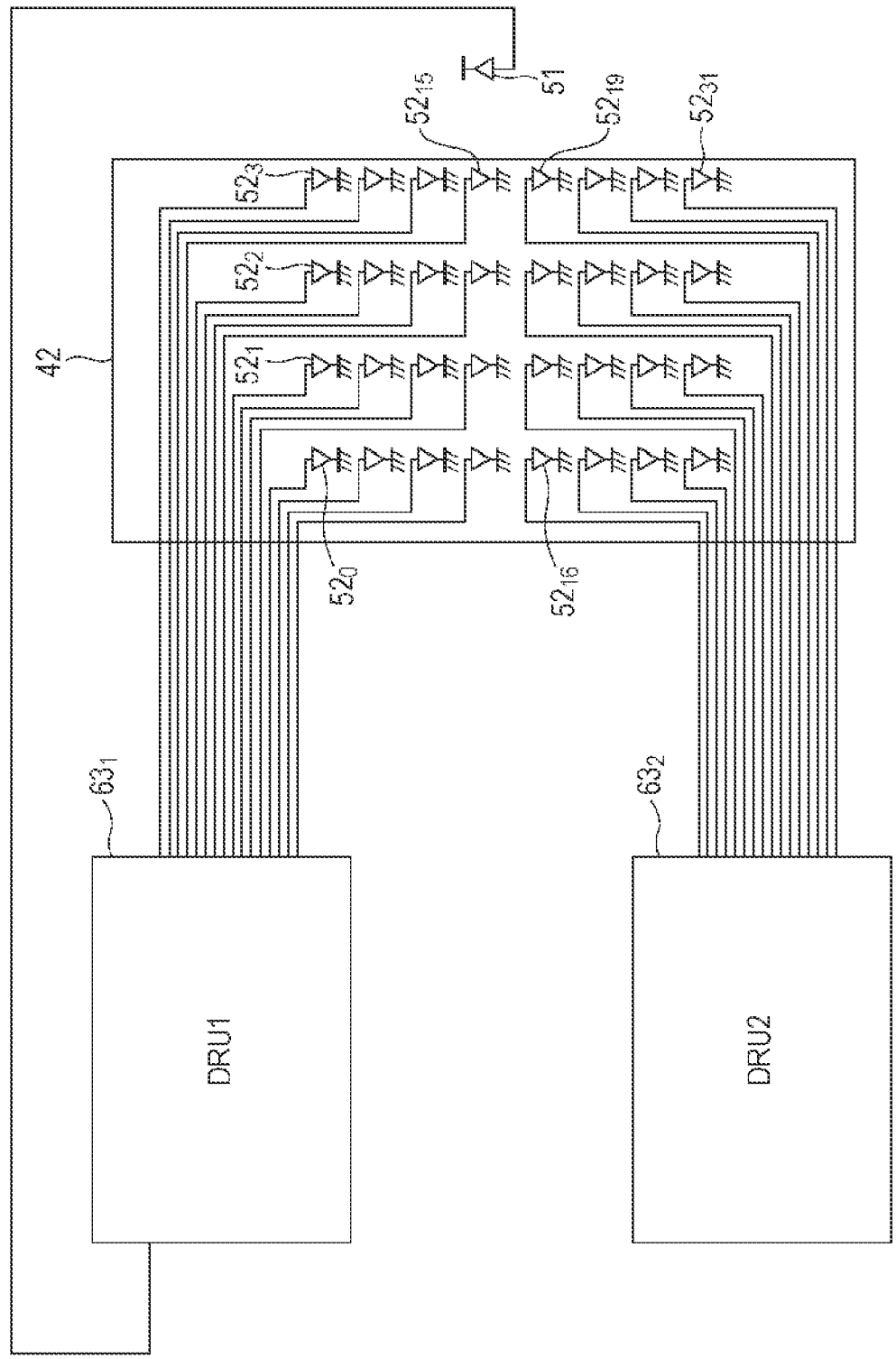
FIG. 5 is a circuit diagram illustrating circuit devices that drive the semiconductor laser array.

The number of semiconductor laser diodes 52 provided in the single semiconductor laser array 42, is set to be, for example, thirty-two. The thirty-two semiconductor laser diodes 52 are driven by plural circuit devices (drivers), which serve as plural mount devices. The number of circuit devices is set to be, for example, two. However, the number of circuit devices may be set to be three or more. In a case where the number of circuit devices is two, as illustrated in FIG. 5, the zero-th to fifteenth semiconductor laser diodes 52 are driven by a first circuit device $63_1$, and the sixteenth to thirty-first semiconductor laser diodes 52 are driven by a second circuit device $63_2$. The number of circuit devices is set in view of productivity, which is determined in accordance with the number of recording sheets on which the image forming apparatus 1 is capable of performing recording per unit time.

In this exemplary embodiment, the single semiconductor laser array 42 is provided, and plural circuit devices (drivers) that drive the semiconductor laser array 42 are provided.

Figure 1:
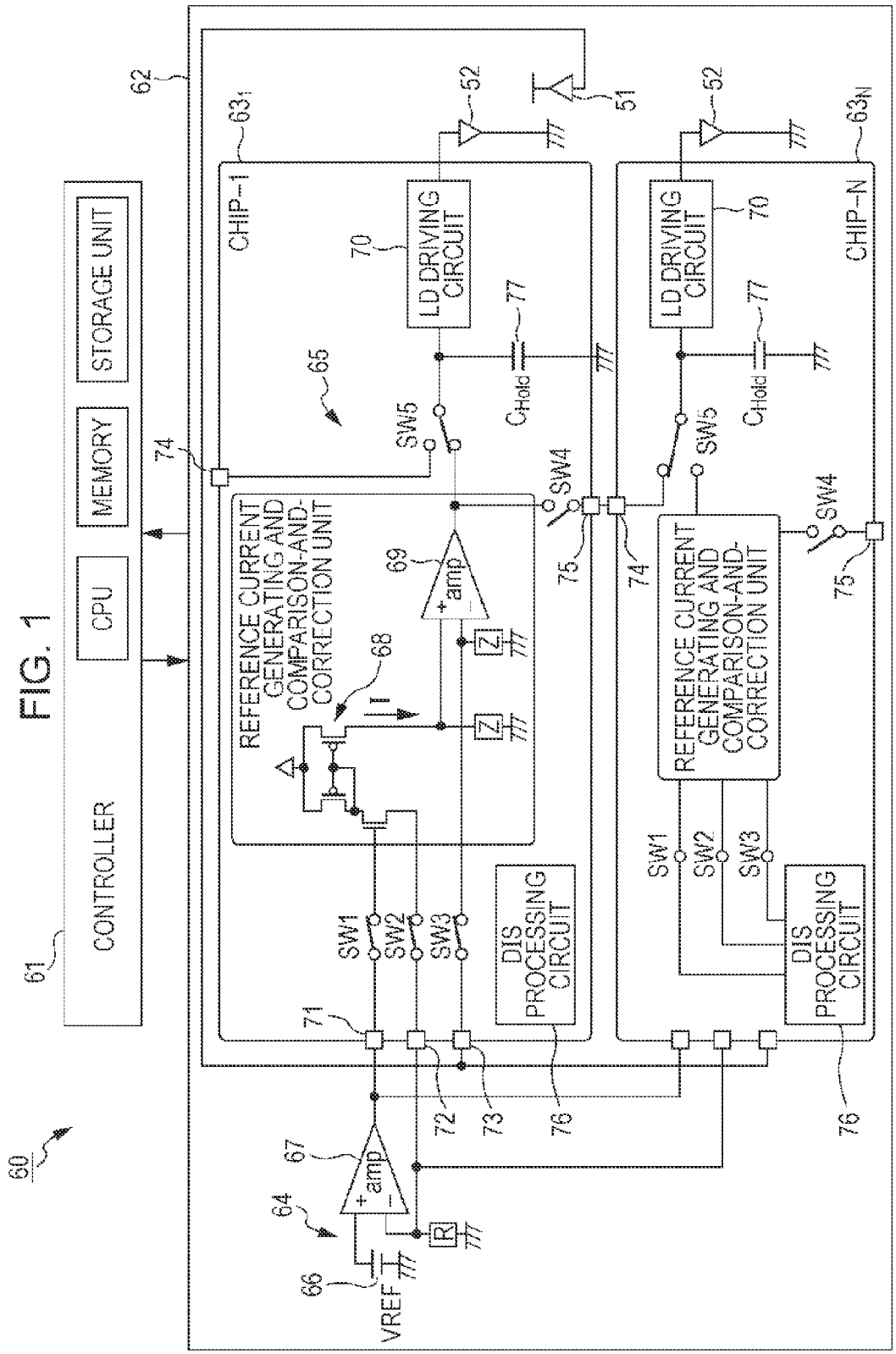
FIG. 1 is a circuit diagram illustrating a light quantity control device according to a first exemplary embodiment of the invention.

FIG. 1 is a circuit diagram illustrating a light quantity control device 60 that drives a semiconductor laser array.

The light quantity control device 60 includes a controller 61, a driving circuit unit 62, and the MPD 51. The controller 61 controls the entire light quantity control device 61, and includes a central processing unit (CPU) serving as a control unit, a memory including a read only memory (ROM) and a random access memory (RAM), and a nonvolatile storage unit including a hard disk drive (HDD), a flash memory, or the like. The controller 61 outputs image data, a main scanning synchronization signal, a control signal, and so forth to the driving circuit unit 62, and controls on/off of switching elements provided in the driving circuit unit 62.

The driving circuit unit 62 includes plural circuit devices 63 (the number thereof is represented by N, which is two in FIG. 1) that drive the semiconductor laser array 42, a common circuit unit 64 that is provided in common for all the circuit devices 63, and auto power control (APC) circuits 65 that are provided for the individual circuit devices 63.

A reference power supply 66, which is represented by VREF and is provided in the common circuit unit 64, has a function of supplying reference power Vref, which corresponds to a reference current. The common circuit unit 64 includes the reference power supply 66, a first differential amplifier (operational amplifier) 67, and a resistor R. The common circuit unit 64 is also connected to the other circuit device $63_N$ in a similar manner.

The APC circuit 65 includes a reference current generating unit 68 that generates a reference current I which is reference, a second differential amplifier (operational amplifier) 69 for auto power control, serving as a comparison and correction unit, a laser diode (LD) driving circuit 70, first to fourth input terminals 71 to 74, one output terminal 75, first to fifth switching elements SW1 to SW5, and a disable (DIS) processing circuit 76.

The reference current generating unit 68 is constituted by, for example, a constant current circuit including two metal oxide semiconductor field-effect transistors (MOSFETs) and one transistor. A base terminal of the transistor is connected to an output terminal of the first differential amplifier 67 via the first switching element SW1 and the first input terminal 71. An emitter terminal of the transistor is connected to the other input terminal of the first differential amplifier 67 via the second switching element SW2 and the second input terminal 72, and the resistor R is disposed between the input terminal and a ground potential.

The reference current I output from the reference current generating unit 68 is converted to a voltage by an I-V converting element Z, and is then input to one input terminal of the second differential amplifier 69. An output current that is output from the MPD 51 in accordance with the quantity of received laser light is converted to a voltage by the I-V converting element Z via the third input terminal 73 and the third switching element SW3, and is then input to the other input terminal of the second differential amplifier 69. An output of the second differential amplifier 69 which performs correction so that the converted voltages are made equal to each other is input to the LD driving circuit 70 via the fifth switching element SW5. The LD driving circuit 70 performs feedback control in accordance with an output from the second differential amplifier 69 so that an output current which is output in accordance with the light quantity of the semiconductor laser diode 52 becomes equal to the reference current I which is determined by the reference current generating unit 68. On the input side of the LD driving circuit 70, a potential holding unit 77 that holds an output voltage of the second differential amplifier 69 is connected in parallel. A sample-and-hold capacitor $C_{Hold}$ is used as the potential holding unit 77, for example. Alternatively, an A/D converter that holds a voltage of an analog value as a digital value may be used as described below, as long as the A/D converter is capable of holding an output value of the second differential amplifier 69.

The output of the second differential amplifier 69 is connected to the output terminal 75 via the fourth switching element SW4. The output terminal 75 is connected to the fourth input terminal 74 of the adjacent N-th (second in FIG. 1) circuit device $63_N$.

The plural circuit devices $63_1$ and $63_N$ have configurations similar to each other. However, the reference current generating unit 68 and the second differential amplifier 69 of the circuit device other than the circuit device $63_1$, which serves as reference, are connected to the DIS processing circuit 76 that stops an operation via the first to third switching elements SW1 to SW3, and do not function. Also, the fifth switching element SW5 is connected to the fourth input terminal 74 side. The first to third switching elements SW1 to SW3 function as switching units that switches the circuit device 63 to a reference circuit device 63 when being connected to the first to third input terminals 71 to 73, and that switches the circuit device 63 to the other circuit device 63 when being connected to the DIS processing circuit 76.

In FIG. 1, each circuit device 63 has only one semiconductor laser diode 52. Actually, however, plural semiconductor laser diodes 52 of the semiconductor laser array 42 are mounted on each circuit device 63. The LD driving circuit 70 causes the individual semiconductor laser diodes 52 of the semiconductor laser array 42 to sequentially emit laser light in time series. Parameters for driving the individual semiconductor laser diodes 52 are changed so that the current generated in accordance with the laser light which is emitted from the individual semiconductor laser diodes 52 and which is received by the MPD 51 is made equal to the reference current I, which is determined by the reference current generating unit 68.

With the above-described configuration, in the image forming apparatus 1 including the light quantity control device 60 according to this exemplary embodiment, the quantity of laser light emitted from the semiconductor laser diodes of the individual semiconductor laser arrays mounted on plural circuit devices is controlled in the following manner.

Referring to FIG. 1, in the light quantity control device 60, an operation of controlling the quantity of laser light emitted from the semiconductor laser diodes $52_0$ to $52_{15}$ of the semiconductor laser array 42 mounted on the reference circuit device $63_1$ is performed in response to an instruction from the controller 61, prior to an image formation operation.

In the APC circuit 65 of the reference circuit device $63_1$, in response to an instruction from the controller 61, the first switching element SW1 is connected to the first input terminal 71, the second switching element SW2 is connected to the second input terminal 72, the third switching element SW3 is connected to the third input terminal 73, the fourth switching element SW4 comes into an off-state, and the fifth switching element SW5 is connected to the LD driving circuit 70 side.

Then, in the APC circuit 65, the zero-th semiconductor laser diode $52_0$ of the semiconductor laser array 42 which is driven by the first circuit device $63_1$ emits laser light, and the quantity of the laser light is detected by the MPD 51. The output current corresponding to the quantity of the laser light which has been emitted from the zero-th semiconductor laser diode $52_0$ of the semiconductor laser array 42 and which has been detected by the MPD 51 is converted to a voltage by the I-V converting element Z via the third input terminal 73 and the third switching element SW3, is input to one input terminal of the second differential amplifier 69, and is compared with the voltage which has been generated by converting, with the I-V converting element Z, the current generated by the reference current generating unit 68 and which has been input to the other input terminal of the second differential amplifier 69, as illustrated in FIG. 1.

The output of the second differential amplifier 69 is input to the LD driving circuit 70 via the fifth switching element SW5. The LD driving circuit 70 performs feedback control on the quantity of laser light by changing a parameter, such as a driving current for driving the first semiconductor laser diode $52_1$, so that the current corresponding to the quantity of laser light emitted from the zero-th semiconductor laser diode $52_0$ is made equal to the reference current I, which is generated by the reference current generating unit 68.

When the current corresponding to the quantity of laser light emitted from the zero-th semiconductor laser diode $52_0$ is made equal to the reference current I, which is generated by the reference current generating unit 68, the output of the second differential amplifier 69 is stored in the potential holding unit 77.

Subsequently, the first to fifteenth semiconductor laser diodes $52_1$ to $52_{15}$ of the semiconductor laser array 42 sequentially emit laser light. The LD driving circuit 70 controls the quantity of the laser light by changing parameters, such as driving currents for driving the second to fifteenth semiconductor laser diodes $52_2$ to $52_{15}$, so that the current corresponding to the quantity of the laser light emitted from the first to fifteenth semiconductor laser diodes $52_1$ to $52_{15}$ of the semiconductor laser array 42 is made equal to the reference current I, which is generated by the reference current generating unit 68.

In this way, in the reference circuit device $63_1$, control is performed so that the quantity of laser light is made equal among the zero-th to fifteenth semiconductor laser diodes $52_0$ to $52_{15}$ of the semiconductor laser array 42.

Figure 6:
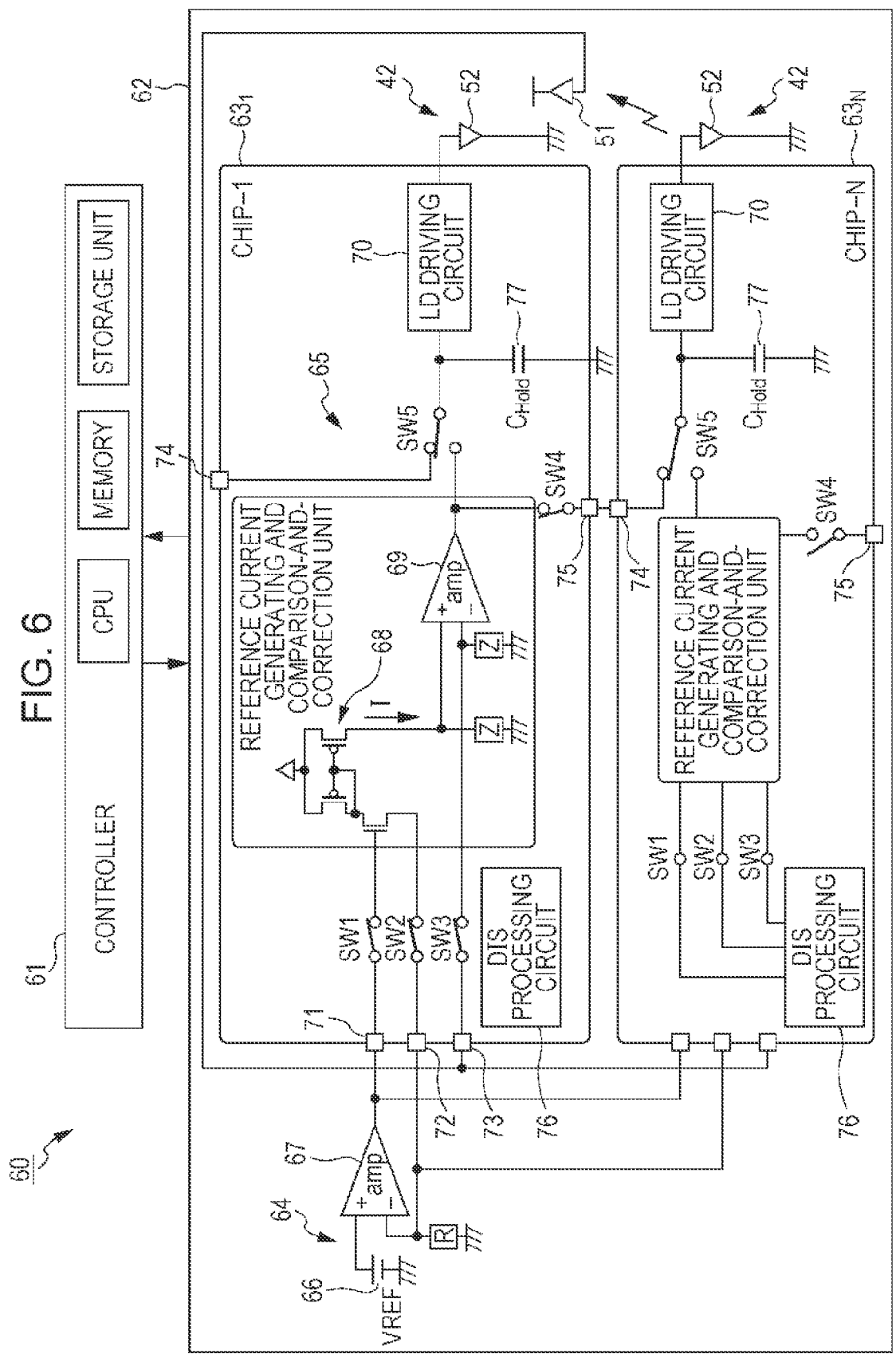
FIG. 6 is a circuit diagram illustrating an operation of the light quantity control device according to the first exemplary embodiment of the invention.

Referring to FIG. 6, in the APC circuit 65 of the N-th (for example, second) circuit device $63_2$, the first to third switching elements SW1 to SW3 are connected to the DIS processing circuit 76, the fourth switching element SW4 comes into an off-state, and the fifth switching element SW5 is switched to the input terminal 74 side, in response to an instruction from the controller 61.

At this time, in the reference circuit device $63_1$, the fourth switching element SW4 comes into an on-state, and the fifth switching element SW5 is switched to the input terminal 74 side.

In the APC circuit 65 of the N-th circuit device $63_N$, the sixteenth semiconductor laser diode $52_{16}$ of the semiconductor laser array 42 emits laser light, and the quantity of the laser light is detected by the MPD 51. The output current corresponding to the quantity of the laser light which has been emitted from the sixteenth semiconductor laser diode $52_{16}$ of the semiconductor laser array 42 and which has been detected by the MPD 51 is converted to a voltage by the I-V converting element Z via the third input terminal 73 and the third switching element SW3 of the reference circuit device $63_1$, is input to one input terminal of the second differential amplifier 69, and is compared with the voltage which has been generated by converting, with the I-V converting element Z, the current generated by the reference current generating unit 68 and which has been input to the other input terminal of the second differential amplifier 69, as illustrated in FIG. 6.

The output of the second differential amplifier 69 is output to the N-th circuit device $63_N$ via the fourth switching element SW4 and the output terminal 75 of the reference circuit device $63_1$. In the N-th circuit device $63_N$, the output is input to the LD driving circuit 70 via the input terminal 74 and the fifth switching element SW5. The LD driving circuit 70 controls the quantity of laser light by changing the parameter for driving the sixteenth semiconductor laser diode $52_{16}$, so that the current corresponding to the quantity of the laser light emitted from the sixteenth semiconductor laser diode $52_{16}$ is made equal to the reference current I, which is generated by the reference current generating unit 68 of the reference circuit device $63_1$.

When the current corresponding to the quantity of laser light emitted from the sixteenth semiconductor laser diode $52_{16}$ is made equal to the reference current I, which is generated by the reference current generating unit 68, the output of the second differential amplifier 69 is stored in the potential holding unit 77.

Subsequently, the seventeenth to thirty-first semiconductor laser diodes $52_{17}$ to $52_{31}$ of the semiconductor laser array 42 which are driven by the N-th circuit device $63_N$ sequentially emit laser light. The LD driving circuit 70 controls the quantity of the laser light by changing driving currents for driving the seventeenth to thirty-first semiconductor laser diodes $52_{17}$ to $52_{31}$, so that the current corresponding to the quantity of laser light emitted from the seventeenth to thirty-first semiconductor laser diodes $52_{17}$ to $52_{31}$ of the semiconductor laser array 42 is made equal to the reference current I, which is generated by the reference current generating unit 68 of the reference circuit device $63_1$.

In the above-described exemplary embodiment, the first circuit device $63_1$ is set to be a reference circuit device 63. Alternatively, another circuit device 63, for example, the N-th circuit device $63_N$, may be set to be a reference circuit device 63 by switching the switching elements SW1 to SW3.

As described above, in the light quantity control device 60 according to the first exemplary embodiment, an output value of the second differential amplifier 69, which compares the quantity of laser light emitted from the semiconductor laser diodes 52 and detected by the MPD 51, with the reference current I generated by the reference current generating unit 68, is used for controlling the quantity of laser light emitted from the semiconductor laser diodes $52_{16}$ to $52_{31}$ of the semiconductor laser array 42 which are driven by another circuit device $63_N$. Accordingly, the quantity of laser light may be controlled so as to be substantially equal among the semiconductor laser diodes 52 of the semiconductor laser array 42 which are driven by different circuit devices 63.

Second Exemplary Embodiment

Figure 7:
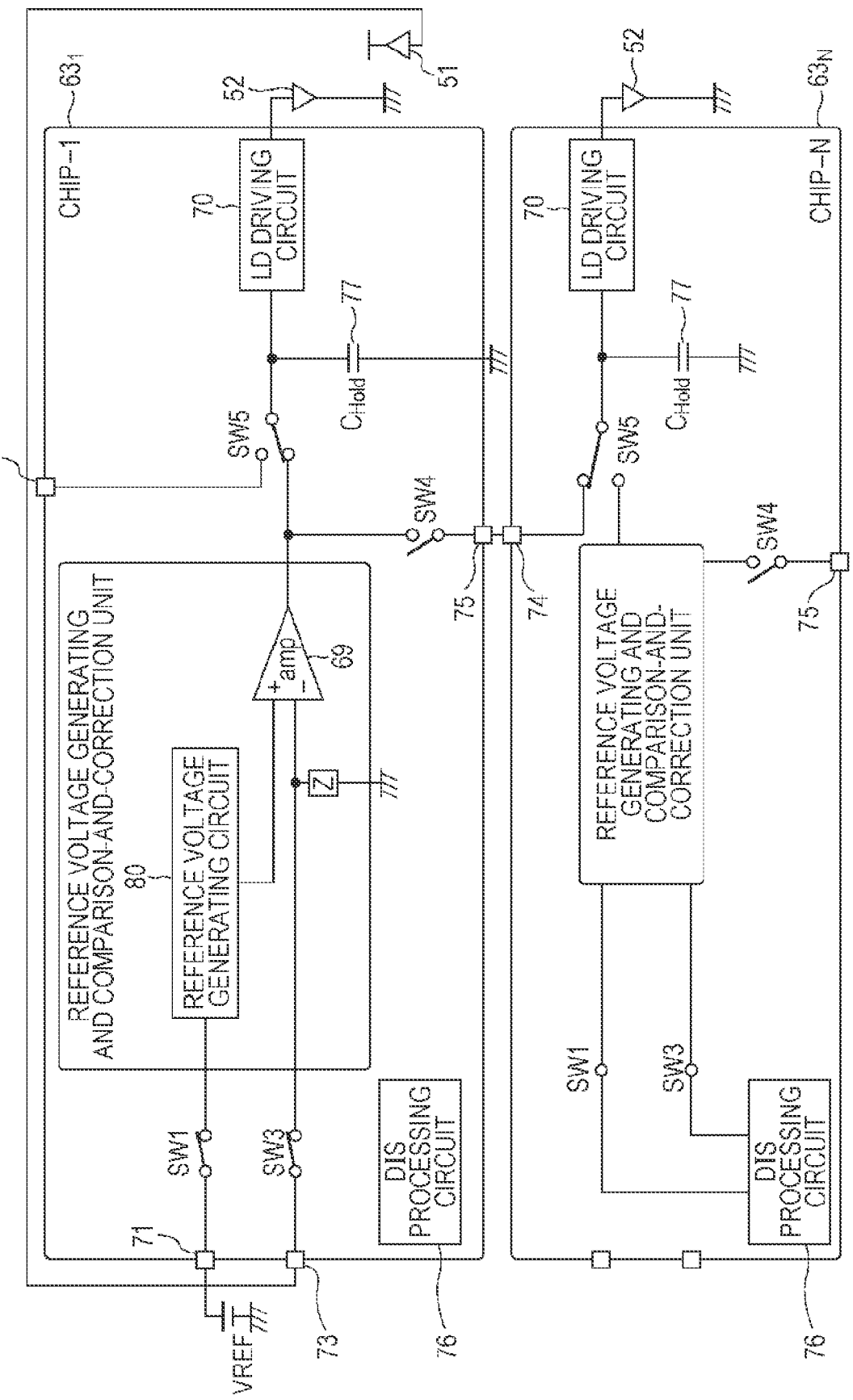
FIG. 7 is a circuit diagram illustrating a light quantity control device according to a second exemplary embodiment of the invention.

FIG. 7 illustrates a second exemplary embodiment of the present invention. In FIG. 2, the same parts as those in the first exemplary embodiment are denoted by the same reference numerals.

In the second exemplary embodiment, as illustrated in FIG. 7, a reference voltage generating circuit 80 serving as a reference voltage generating unit is provided instead of the reference current generating circuit 68. The reference voltage generating circuit 80 generates a predetermined reference voltage corresponding to a desired quantity of laser light emitted from the semiconductor laser diodes 52, in accordance with the reference voltage VREF provided in the common circuit unit 64, and includes a resistor and a switching element such as a transistor.

The reference voltage generated by the reference voltage generating circuit 80 is input to one input terminal of the second differential amplifier 69, and is compared with a voltage which is output in accordance with the quantity of laser light detected by the MPD 51, which is generated through conversion performed by the I-V converting element Z, and which is input to the other input terminal of the second differential amplifier 69.

In this way, the reference voltage generated by the reference voltage generating circuit 80 may be used as a reference value which is compared by the second differential amplifier 69 with a value detected by the MPD 51.

Third Exemplary Embodiment

Figure 8:
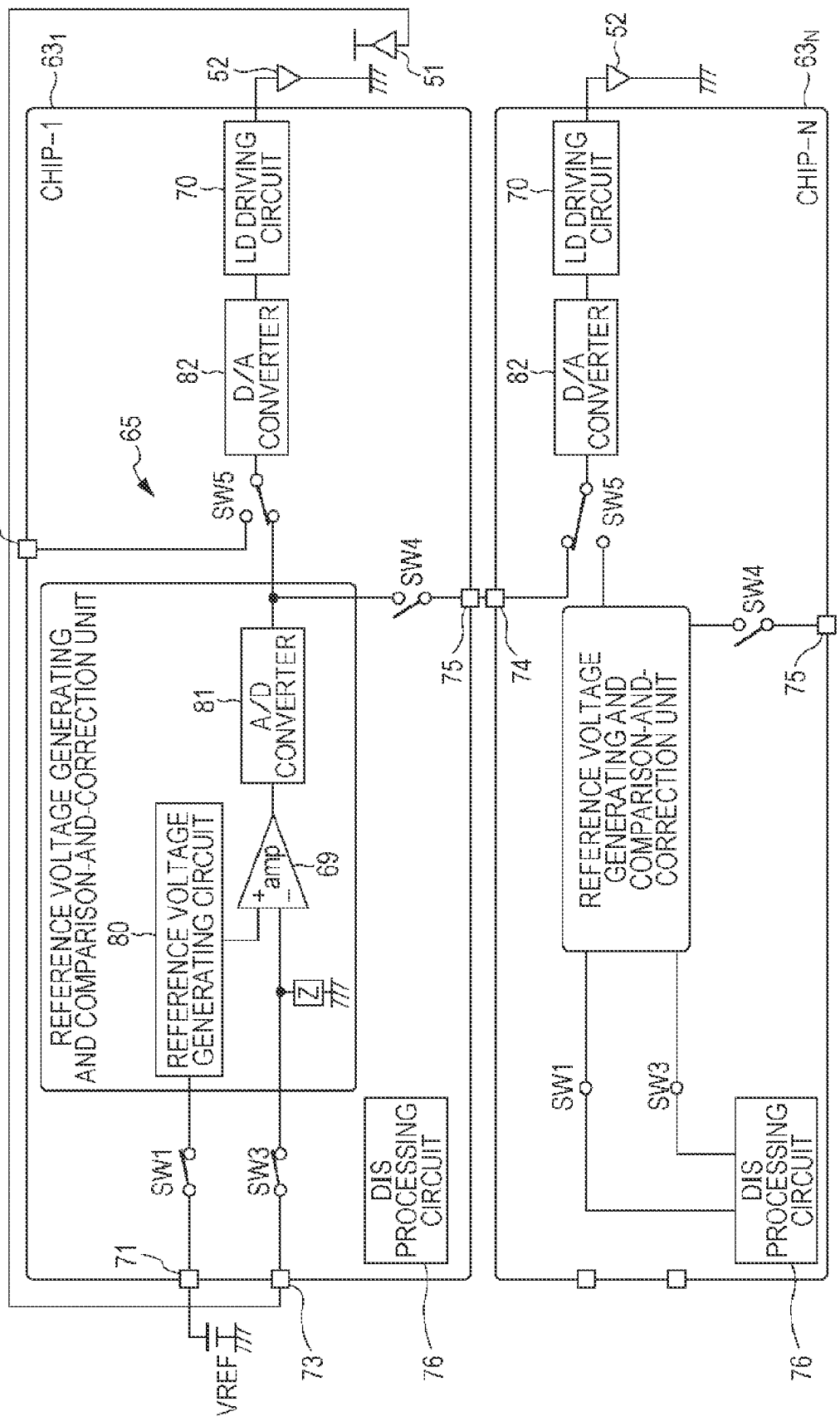
FIG. 8 is a circuit diagram illustrating a light quantity control device according to a third exemplary embodiment of the invention.

FIG. 8 illustrates a third exemplary embodiment of the present invention. In FIG. 8, the same parts as those in the first and second exemplary embodiments are denoted by the same reference numerals.

In the third exemplary embodiment, as illustrated in FIG. 8, an output result of the second differential amplifier 69 is not output as an analog signal (data), but is converted to a digital signal (data) by an A/D converter 81 serving as an A/D converting unit connected to the subsequent stage (output side) of the second differential amplifier 69. The A/D converter 81 outputs the output result of the second differential amplifier 69 which has been converted to a digital signal (data) as a parallel signal (data), and includes signal lines, the number of which corresponds the number of bits of the digital signal (data).

A D/A converter 82 serving as a D/A converting unit is disposed in the preceding stage (input side) of the LD driving circuit 70. The D/A converter 82 converts an output result of the second differential amplifier 69 to an analog signal (data) and then inputs the output result to the LD driving circuit 70. Also, the D/A converter 82 also has a function as a memory for storing an output result of the second differential amplifier 69.

The output result of the second differential amplifier 69 is converted to a digital signal (data) by the A/D converter 81, and is then output as a digital signal (data) from the output terminal 75, serving as an output unit, via the fourth switching element SW4.

In this way, the output result of the second differential amplifier 69 is output after being converted to a digital signal (data) by the A/D converter 81. Also, the A/D converter 81 outputs the output result of the second differential amplifier 69 which has been converted to a digital signal (data) as a parallel signal (data).

Fourth Exemplary Embodiment

Figure 9:
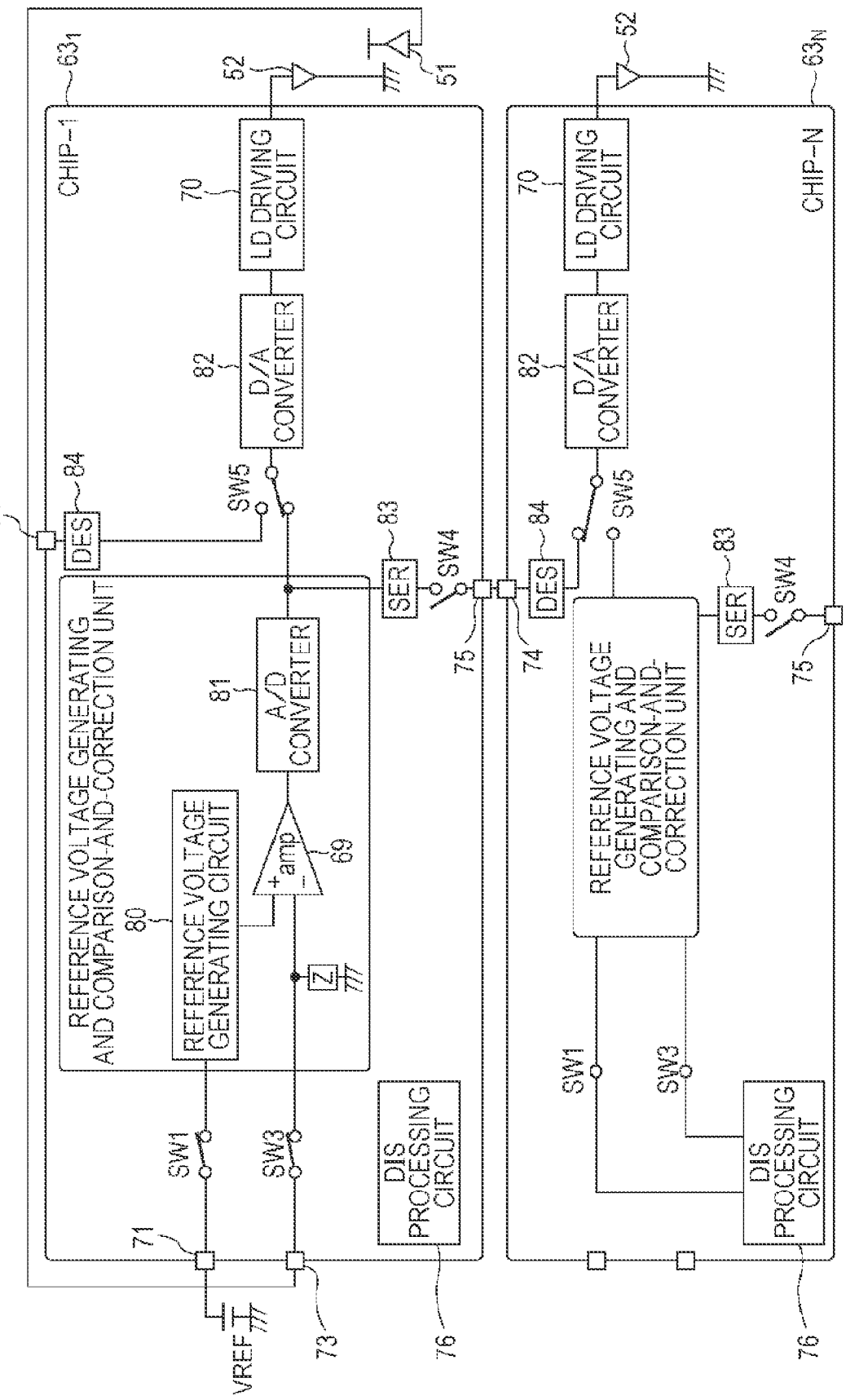
FIG. 9 is a circuit diagram illustrating a light quantity control device according to a fourth exemplary embodiment of the invention.

FIG. 9 illustrates a fourth exemplary embodiment of the present invention. In FIG. 9, the same parts as those in the first and second exemplary embodiments are denoted by the same reference numerals.

In the fourth exemplary embodiment, as illustrated in FIG. 9, an output result of the second differential amplifier 69 is converted to a digital signal (data) by the A/D converter 81 serving as an A/D converting unit, a parallel signal (data) is converted to a serial signal (data) by a serial signal output circuit 83 serving as a serial signal output unit, and the serial signal is output from the output terminal 75.

A parallel signal output circuit 84 serving as a parallel signal output unit is provided for the input terminal 74 of the circuit device 63. The parallel signal output circuit 84 converts a serial signal (data) to a parallel signal (data).

In this way, an output result of the second differential amplifier 69 which has been converted to a digital signal (data) by the A/D converter 81 is output as a serial signal (data).

In the above-described exemplary embodiments, the number of circuit devices 63 is two. Of course, the number of circuit devices 63 is not limited to two, and three or more circuit devices 63 may be provided. In this case, for example, the output terminal 75 of the reference circuit device 63 is directly connected to the input terminal 74 of the third circuit device 63 or to the input terminals 74 of the third to N-th circuit devices 63.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light quantity control device comprising:
a light quantity detecting unit that detects a quantity of laser light emitted from semiconductor laser elements which are mounted on a plurality of circuit devices; and
an output unit that is provided on at least a reference circuit device among the plurality of circuit devices and that outputs, to another circuit device other than the reference circuit device among the plurality of circuit devices, an output result which is obtained through comparison and correction of a value detected by the light quantity detecting unit and a reference value,
wherein each of the plurality of circuit devices includes:
a reference current generating unit that generates a reference current,
a comparison and correction unit that compares the reference current with a photocurrent which is output from the light quantity detecting unit, after converting the reference current and the photocurrent to voltages, and that performs correction so that the voltages are made equal to each other,
a current controller that controls, in accordance with an output result obtained from the comparison and correction unit, a driving current for driving the semiconductor laser elements; and
an operation stopping unit that is electrically coupled to the reference current generating unit and the comparison and correction unit,
wherein the operation stopping units are configured to stop the operation of the reference current generating unit and the comparison and correction unit of the another circuit device other than the reference circuit device among the plurality of circuit devices.

2. The light quantity control device according to claim 1, wherein each of the plurality of circuit devices further includes a memory that stores the output result obtained from the comparison and correction unit.

3. The light quantity control device according to claim 1, wherein each of the plurality of circuit devices further includes an analog-to-digital converting unit that performs analog-to-digital conversion on the output result obtained from the comparison and correction unit.

4. The light quantity control device according to claim 3, wherein each of the plurality of circuit devices outputs the output result which has been converted to a digital signal by the analog-to-digital converting unit, the output result being output as a parallel signal.

5. The light quantity control device according to claim 3, wherein each of the plurality of circuit devices outputs the output result which has been converted to a digital signal by the analog-to-digital converting unit, the output result being output as a serial signal.

6. The light quantity control device according to claim 1, further comprising:
a switching unit that switches between the reference circuit device and the other circuit device.

7. An exposure device comprising:
a plurality of semiconductor laser elements;
the light quantity control device according to claim 1, the light quantity control device controlling a quantity of laser light emitted from the plurality of semiconductor laser elements; and
an optical scanning system that causes a surface of a photoconductor to be exposed in a scanning manner to the laser light emitted from the plurality of semiconductor laser elements.

8. An image forming apparatus comprising:
the exposure device according to claim 7; and
a photoconductor that is exposed in a scanning manner to laser light by the exposure device in accordance with image data.

9. A light quantity control device comprising:
a light quantity detecting unit that detects a quantity of laser light emitted from semiconductor laser elements which are mounted on a plurality of circuit devices; and
an output unit that is provided on at least a reference circuit device among the plurality of circuit devices and that outputs, to another circuit device other than the reference circuit device among the plurality of circuit devices, an output result which is obtained through comparison and correction of a value detected by the light quantity detecting unit and a reference value,
wherein each of the plurality of circuit devices includes:
 a reference voltage generating unit that generates a reference voltage,
 a comparison and correction unit that compares the reference voltage with a photocurrent which is output from the light quantity detecting unit, after converting the photocurrent to a voltage, and that performs correction so that the reference voltage and the converted voltage are made equal to each other,
 a current controller that controls, in accordance with an output result obtained from the comparison and correction unit, a driving current for driving the semiconductor laser elements; and
 an operation stopping unit that is electrically coupled to the reference voltage generating unit and the comparison and correction unit,
wherein the operation stopping units are configured to stop the operation of the reference voltage generating unit and the comparison and correction unit of the another circuit device other than the reference circuit device among the plurality of circuit devices.

10. The light quantity control device according to claim 9, wherein each of the plurality of circuit devices further includes a memory that stores the output result obtained from the comparison and correction unit.

11. The light quantity control device according to claim 9, wherein each of the plurality of circuit devices further includes an analog-to-digital converting unit that performs analog-to-digital conversion on the output result obtained from the comparison and correction unit.

12. The light quantity control device according to claim 11, wherein each of the plurality of circuit devices outputs the output result which has been converted to a digital signal by the analog-to-digital converting unit, the output result being output as a parallel signal.

13. The light quantity control device according to claim 11, wherein each of the plurality of circuit devices outputs the output result which has been converted to a digital signal by the analog-to-digital converting unit, the output result being output as a serial signal.

* * * * *